United States Patent
Ogasawara et al.

(10) Patent No.: US 11,467,218 B2
(45) Date of Patent: Oct. 11, 2022

(54) BATTERY DEGRADATION DETECTION DEVICE AND BATTERY TEMPERATURE ESTIMATION DEVICE

(71) Applicant: Mitsubishi Electric Corporation, Tokyo (JP)

(72) Inventors: Keisuke Ogasawara, Tokyo (JP); Toshihiro Wada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 34 days.

(21) Appl. No.: 16/978,770

(22) PCT Filed: May 7, 2018

(86) PCT No.: PCT/JP2018/017637
§ 371 (c)(1),
(2) Date: Sep. 8, 2020

(87) PCT Pub. No.: WO2019/215786
PCT Pub. Date: Nov. 14, 2019

(65) Prior Publication Data
US 2020/0408844 A1    Dec. 31, 2020

(51) Int. Cl.
*G01R 31/389*    (2019.01)
*G01K 13/00*    (2021.01)
(Continued)

(52) U.S. Cl.
CPC ........... *G01R 31/389* (2019.01); *G01K 13/00* (2013.01); *G01R 31/374* (2019.01);
(Continued)

(58) Field of Classification Search
CPC .. G01R 31/389; G01R 31/374; G01R 31/392; G01R 31/44; G01R 31/36;
(Continued)

(56) References Cited

U.S. PATENT DOCUMENTS

| | | | |
|---|---|---|---|
| 2016/0195588 A1* | 7/2016 | Ikeda | H01M 10/48 324/430 |
| 2017/0350946 A1* | 12/2017 | Mukaitani | H01M 50/20 |
| 2018/0267108 A1* | 9/2018 | Morita | G01R 31/396 |

FOREIGN PATENT DOCUMENTS

| | | | | |
|---|---|---|---|---|
| JP | 2000-133322 A | | 5/2000 | |
| JP | 2015025751 A | * | 2/2015 | ............. G01R 31/36 |
| JP | 2017-044569 A | | 3/2017 | |

OTHER PUBLICATIONS

International Search Report and Written Opinion dated Jun. 26, 2018 for PCT/JP2018/017637 filed on May 7, 2018, 8 pages including English Translation of the International Search Report.

* cited by examiner

*Primary Examiner* — Patrick Assouad
*Assistant Examiner* — Trung Q Nguyen
(74) *Attorney, Agent, or Firm* — Xsensus LLP

(57) ABSTRACT

The battery degradation detection device includes an impedance measurement unit and a degradation detection unit. The impedance measurement unit measures impedances of a battery at a plurality of frequencies. The impedance for at least one of the plurality of frequencies, measured by the impedance measurement unit, has a positive imaginary component. The degradation detection unit detects degradation of the battery on the basis of real components of the impedances at the plurality of frequencies detected by the impedance measurement unit.

11 Claims, 13 Drawing Sheets

(51) Int. Cl.
*H01M 10/42* (2006.01)
*G01R 31/392* (2019.01)
*H01M 10/48* (2006.01)
*G01R 31/374* (2019.01)

(52) U.S. Cl.
CPC ...... *G01R 31/392* (2019.01); *H01M 10/4285* (2013.01); *H01M 10/48* (2013.01)

(58) Field of Classification Search
CPC .............. G01R 31/3648; H01M 10/48; H01M 10/4285; H01M 2010/4271; G01K 13/00; H02J 7/00; H02J 7/007; H02J 7/04; Y02E 60/10
USPC .......... 324/400, 430, 433, 500, 600, 764.01, 324/103 R, 771, 761.01, 501, 639, 642, 324/702, 76.11, 76.66, 96
See application file for complete search history.

BATTERY DEGRADATION DETECTION DEVICE AND BATTERY TEMPERATURE ESTIMATION DEVICE

CROSS-REFERENCE TO RELATED APPLICATION

The present application is based on PCT filing PCT/JP2018/017637, filed May 7, 2018, the entire contents of which are incorporated herein by reference.

TECHNICAL FIELD

The present invention relates to a battery degradation detection device for detecting degradation of a battery, and a battery temperature estimation device for estimating the internal temperature of a battery.

BACKGROUND ART

In the case where various batteries such as a lead storage battery are used as backup power supplies or vehicle power supplies, it is required that discharge can be immediately performed at the maximum current. However, depending on the state of the battery, the original performance of the battery is not exerted and thus the required function is not satisfied. In order to obtain the original performance of the battery, it is necessary to appropriately monitor the state of the battery.

Patent Document 1 describes technology of calculating an electrolyte solution resistance and an electrode resistance on the basis of a current value and a terminal voltage value at a plurality of time points and estimating the life of a secondary battery on the basis of the calculated values. In Patent Document 2, a complex impedance of a secondary battery is acquired, an equivalent circuit of the secondary battery is fitted to change in the complex impedance with respect to frequency, and the amount of metal nickel is calculated from a value based on a capacitor element representing a reaction resistance in the equivalent circuit. The battery state of the secondary battery is estimated on the basis of the above calculation result.

CITATION LIST

Patent Document

Patent Document 1: Japanese Laid-Open Patent Publication No. 2017-44569
Patent Document 2: Japanese Laid-Open Patent Publication No. 2000-133322

SUMMARY OF THE INVENTION

Problems to be Solved by the Invention

As shown in Patent Documents 1, 2, methods for detecting degradation of a battery due to an electrolyte solution or an electrode as the state of the battery are known. However, degradation of a battery can be also caused by another factor. Specifically, if a current collecting portion in a battery is corroded, the original performance of the battery is not exerted. In the methods shown in Patent Documents 1, 2, degradation of a battery due to corrosion of a current collecting portion cannot be detected.

The present invention has been made to solve the above problem, and an object of the present invention is to obtain a battery degradation detection device capable of detecting degradation of a battery due to corrosion of a current collecting portion.

In addition, as the state of a battery, the internal temperature of the battery is required to be monitored. However, although the exterior temperature of the battery or the temperature around the battery can be measured, it is difficult to measure the internal temperature of the battery.

Another object of the present invention is to obtain a battery temperature estimation device capable of estimating the internal temperature of the battery.

Solution to the Problems

A battery degradation detection device according to the present invention includes: an impedance measurement unit for measuring impedances of a battery at a plurality of frequencies; and a degradation detection unit for detecting degradation of the battery on the basis of real components of the impedances at the plurality of frequencies measured by the impedance measurement unit, wherein the impedance for at least one of the plurality of frequencies has a positive imaginary component.

A battery temperature estimation device according to the present invention includes: an impedance measurement unit for measuring impedances of a battery at a plurality of frequencies; and a temperature estimation unit for estimating an internal temperature of the battery on the basis of real components of the impedances at the plurality of frequencies measured by the impedance measurement unit, wherein the impedance for at least one of the plurality of frequencies has a positive imaginary component.

Effect of the Invention

The battery degradation detection device according to the present invention makes it possible to detect degradation of a battery due to corrosion of a current collecting portion. In addition, the battery temperature estimation device according to the present invention makes it possible to estimate the internal temperature of a battery.

DESCRIPTION OF EMBODIMENTS

Figure 1:
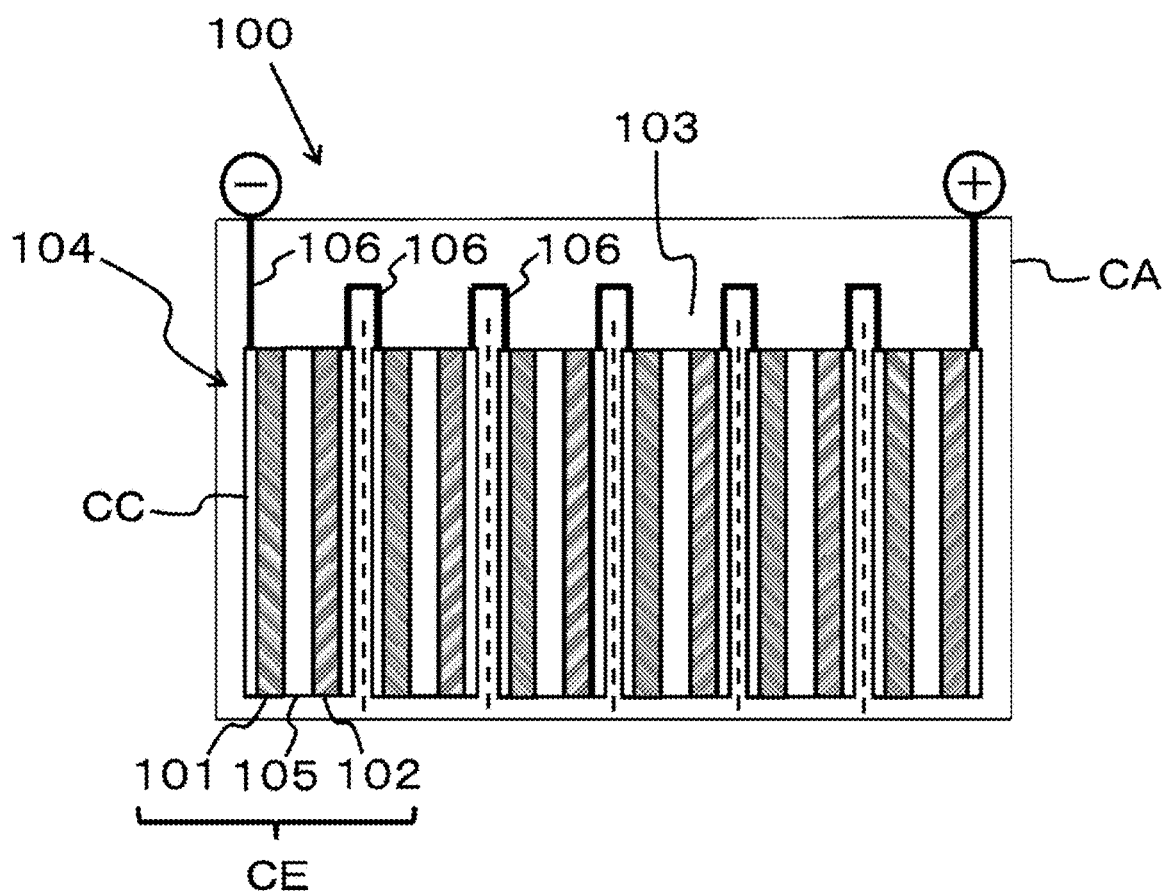
FIG. 1 is a schematic diagram showing the internal structure of a lead storage battery.

Hereinafter, a battery degradation detection device and a battery temperature estimation device according to embodiments of the present invention will be described with reference to the drawings. In the drawings, the same parts or substantially the same parts are denoted by the same reference characters, for description. In addition, the drawings are schematically shown and thus dimensions and shapes are not necessarily precise.

In the embodiments, as a battery, a lead storage battery is used. However, another battery may be used. For example, a primary battery such as a lithium/manganese dioxide battery or another secondary battery is also applicable in the present invention. In addition, the shape of the battery is not limited. Various shapes of batteries such as a stacked-type, a wound-type, and a button-type are applicable in the present invention.

[Summary of Battery]

FIG. 1 is a schematic diagram showing the internal structure of a lead storage battery. As shown in FIG. 1, a lead storage battery 100 includes a casing CA, a current collector grid CC, and a plurality of (in this example, six) battery elements CE. The current collector grid CC is housed in the casing CA. In the casing CA, the plurality of battery elements CE are retained by the current collector grid CC. Each battery element CE includes a positive electrode 101, a negative electrode 102, and a separator 105. The separator 105 is located between the positive electrode 101 and the negative electrode 102. The casing CA is filled with an electrolyte solution 103. In this example, the positive electrode 101 is formed from lead dioxide ($PbO_2$), and the negative electrode 102 is formed from spongy lead (Pb). As the electrolyte solution, lead sulfate ($PbSO_4$) is used. The current collector grid CC functions as a current collector of each positive electrode 101 and each negative electrode 102. As the material of the current collector grid CC, for example, lead (Pb) is used. As the material of the current collector grid CC, antimony (Sb), tin (Sn), or the like may be used in addition to lead. A plurality of wirings 106 made of the same material as the current collector grid CC are connected to the current collector grid CC. The plurality of battery elements CE are connected in series via these wirings 106. The current collector grid CC and the plurality of wirings 106 form a current collecting portion 104.

When the lead storage battery 100 is discharged, a reaction represented by the following Expression (1) occurs at the positive electrode 101, and a reaction represented by the following Expression (2) occurs at the negative electrode 102. When the lead storage battery 100 is charged, a reaction opposite to the reaction represented by the following Expression (1) occurs at the positive electrode 101, and a reaction opposite to the reaction represented by the following Expression (2) occurs at the negative electrode 102.

$$PbO_2 + 4H^+ + SO_4^{2-} + 2e^- \leftrightarrow PbSO_4 + 2H_2O \quad (1)$$

$$Pb + SO_4^{2-} \leftrightarrow PbSO_4 + 2e^- \quad (2)$$

By applying AC voltage/current to the lead storage battery 100, the impedance of the lead storage battery 100 can be measured on the basis of the resultant current response or voltage response. Since the impedance is a complex number, the impedance Z can be represented using a real component Zre and an imaginary component Zim as shown in the following Expression (3).

$$Z = Zre - jZim \quad (3)$$

Figure 2:
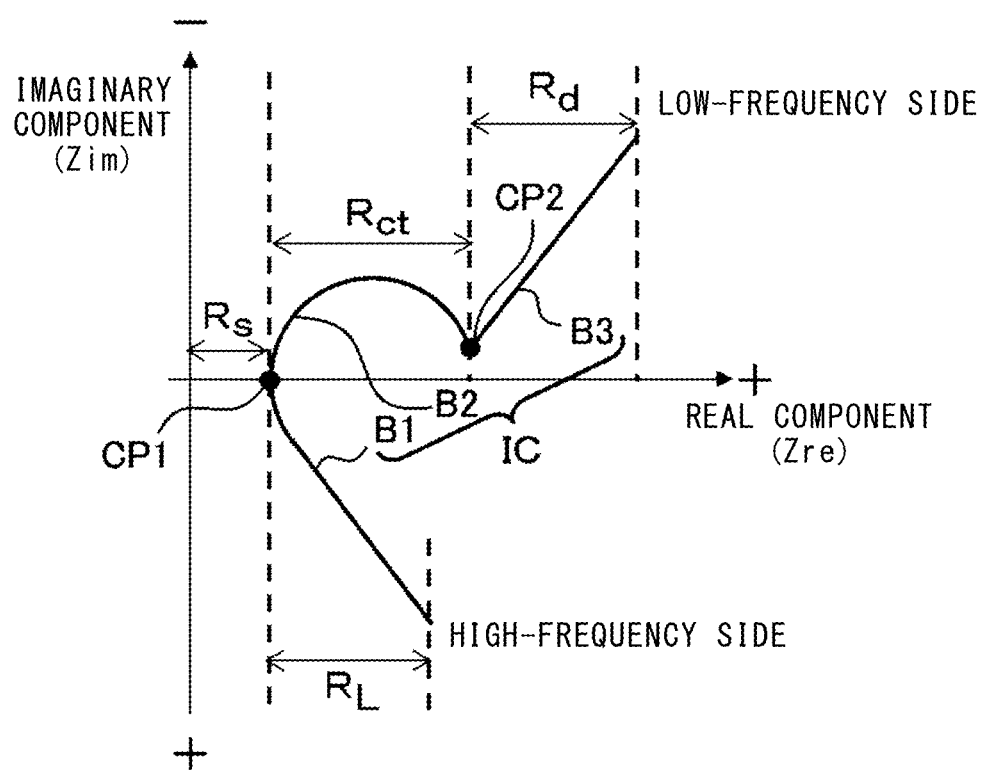
FIG. 2 shows an example of an impedance Nyquist diagram of a lead storage battery.

The impedance of the lead storage battery 100 can be represented by an impedance Nyquist diagram. FIG. 2 shows an example of an impedance Nyquist diagram of the lead storage battery 100. The horizontal axis indicates the real component Zre of the impedance, and the vertical axis indicates the imaginary component Zim of the impedance. The positive-negative direction of the vertical axis is inverted upside down.

In the case where lag of the phase is assumed, using |Z| as the absolute value of the impedance and φ as a phase difference, the real component Zre of the impedance is represented by Expression (4), and the imaginary component Zim of the impedance is represented by Expression (5).

$$Zre = |Z| \cos \phi \quad (4)$$

$$Zim = -|Z| \sin \theta \quad (5)$$

The impedance Nyquist diagram IC in FIG. 2 shows change in the impedance in a certain frequency range. The frequency range is divided into a high-frequency range, a middle frequency range, and a low-frequency range. The value of the frequency descends in the order of, from the highest, high-frequency range, middle frequency range, and then low-frequency range. In the example in FIG. 2, the impedance Nyquist diagram IC includes parts B1, B2, B3. The part B1 has substantially a linear shape and represents the impedance in the high-frequency range. The part B2 has substantially an arc shape and represents the impedance in the middle frequency range. The part B3 has substantially a linear shape and represents the impedance in the low-frequency range. The part B1 and the part B2 are connected to each other at a connection point CP1, and the part B2 and the part B3 are connected to each other at a connection point CP2. Irrespective of whether or not the battery 100 is degraded, the high-frequency range, the middle frequency range, and the low-frequency range at the parts B1, B2, B3 are each almost constant.

In this example, the part B1 is in a range where the imaginary component is equal to or greater than 0, and the parts B2, B3 are in a range where the imaginary component is negative. At the connection point CP1, the imaginary component is 0, and the real component is Rs. The real component Rs is the smallest value of the real components in the parts B1, B2. It is noted that the imaginary component at the connection point CP1 may be positive or negative.

The real component Rs corresponds to the resistance (viscous resistance) of sulfuric acid in the electrolyte solution 103 and the electric resistance (DC resistance) of the current collecting portion 104. The electric resistance (DC resistance) of a wiring (hereinafter, referred to as measurement wiring) connected to the lead storage battery 100 for measurement of the impedance may influence the real component Rs. The electric resistance (DC resistance) R of a general metal conductor is represented by the following Expression (6), using p as electric resistivity, A as the sectional area of the conductor, and l as the length of the conductor. If the sectional area A of the conductor is reduced, the electric resistance R of the conductor increases. In addition, if the length 1 of the conductor increases, the electric resistance R of the conductor increases.

$$R = \rho \frac{l}{A} \quad (6)$$

Hereinafter, the difference between the maximum value and the minimum value of the real component in each of the parts B1, B2, B3 is referred to as real component width $R_L$, $R_{Ct}$, $R_d$, respectively. The real component width $R_L$ corresponds to a resistance due to a skin effect in the current collecting portion 104. It is noted that, depending on the measurement condition for the impedance, another component may influence the real component width $R_L$. For example, in the case where the length or the thickness of the measurement wiring is great, a resistance component due to a skin effect of the measurement wiring influences the real component width $R_L$.

The skin effect is a phenomenon in which, when AC current flows through a metal conductor, the current density in a part (skin) near the conductor surface becomes high and the current density in a part away from the conductor surface becomes low. The depth (distance from surface) at which current is 1/e of the surface current in the conductor is called skin depth. Where the electric resistivity of the conductor is denoted by p, the angular frequency is denoted by ω, and the absolute permeability of the conductor is denoted by μ, the skin depth d is represented by the following Expression (7).

$$d = \sqrt{\frac{2\rho}{\omega\mu}} \quad (7)$$

As the frequency increases, the current concentrates to the conductor surface, and thus the AC resistance increases. As the thickness of the conductor increases, the influence of the skin effect increases and thus the AC resistance increases. As the thickness of the conductor is reduced, the influence of the skin effect is reduced and thus the AC resistance is reduced.

The imaginary component in the part B1 corresponds to an inductance component of the current collecting portion 104. Depending on the measurement condition for the impedance, another component (e.g., an inductance component of the measurement wiring) may influence the imaginary component in the part B1.

The impedance in the parts B2, B3 is due to reactions of the positive electrode 101 and the negative electrode 102. Specifically, the real component width $R_{Ct}$ in the part B2 corresponds to the reaction resistance (charge movement resistance) of the positive electrode 101 and the negative electrode 102. The real component width $R_d$ in the part B3 corresponds to the diffusion resistance of sulfate ions in the positive electrode 101 and the negative electrode 102. The imaginary component in the parts B2, B3 corresponds to a capacitive component such as an electric double layer capacitance.

Factors of degradation of the lead storage battery 100 include corrosion of the current collecting portion 104, electrolysis of water in the electrolyte solution 103, and changes in the states of the positive electrode 101 and the negative electrode 102. For example, if the current collector grid CC is corroded due to overcharge or the like, the sectional area of the current collector grid CC is reduced or adhesion between the current collector grid CC and an active material is reduced. Thus, the resistance at the current collector grid CC increases. In addition, if water in the electrolyte solution 103 is electrolyzed due to overcharge or the like, the electrolyte solution 103 is decreased so that the positive electrode 101 or the negative electrode 102 is exposed, or the sulfuric acid density in the electrolyte solution 103 increases so that corrosion of the current collecting portion 104 is accelerated. Further, at the positive electrode 101, the lead dioxide is softened through repetition of charging and discharging, and as the softening progresses, the lead dioxide might drop from the positive electrode 101. In addition, at the negative electrode 102, lead sulfate generated during discharging might be deposited as sulfation.

Embodiment 1

A battery degradation detection device according to embodiment 1 of the present invention will be described.

The battery degradation detection device according to the present embodiment detects degradation of the battery 100 due to corrosion of the current collecting portion 104. In the following description, a real component of the impedance of the battery 100 is referred to as impedance real component, and an imaginary component of the impedance of the battery 100 is referred to as impedance imaginary component.

Figure 3:
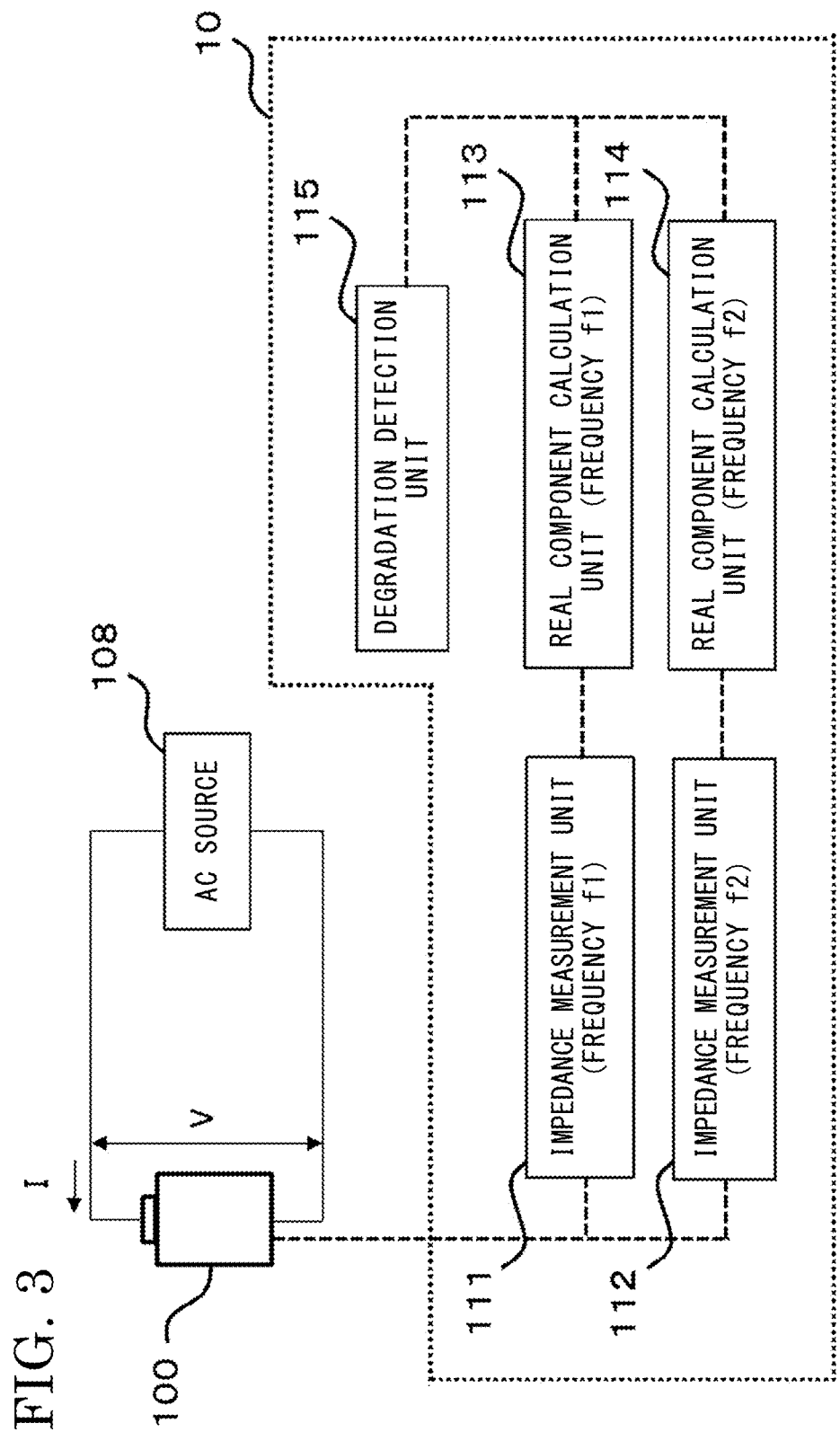
FIG. 3 is a block diagram showing the configuration of a battery degradation detection device according to embodiment 1.

FIG. 3 is a block diagram showing the configuration of the battery degradation detection device according to embodiment 1. As shown in FIG. 3, the battery 100 is connected to an AC source 108. The AC source 108 provides an AC signal to the battery 100. In this case, effective current provided to the battery 100 is I, and effective voltage provided thereto is V. The battery degradation detection device 10 includes impedance measurement units 111 and 112, real component calculation units 113 and 114, and a degradation detection unit 115.

The impedance measurement unit 111 measures the impedance of the battery 100 at a frequency f1 on the basis of a current response or a voltage response of the battery 100. The impedance measurement unit 112 measures the impedance of the battery 100 at a frequency f2 on the basis of a current response or a voltage response of the battery 100. The frequency f1 is an example of a first frequency, and the frequency f2 is an example of a second frequency. The frequencies f1, f2 are set such that an imaginary component of the impedance for at least one of the frequencies f1, f2 is positive and the frequency f2 is greater than the frequency f1. In this example, impedances for two points in the part B1 of the impedance Nyquist diagram IC in FIG. 2 are measured. As described above, the influence of the skin effect in the current collecting portion 104 is dominant for the impedance in the part B1.

The real component calculation unit 113 calculates a real component of the impedance measured by the impedance measurement unit 111 (impedance measured at frequency f1). The real component calculation unit 114 calculates a real component of the impedance measured by the impedance measurement unit 112 (impedance measured at frequency f2).

Figure 4:
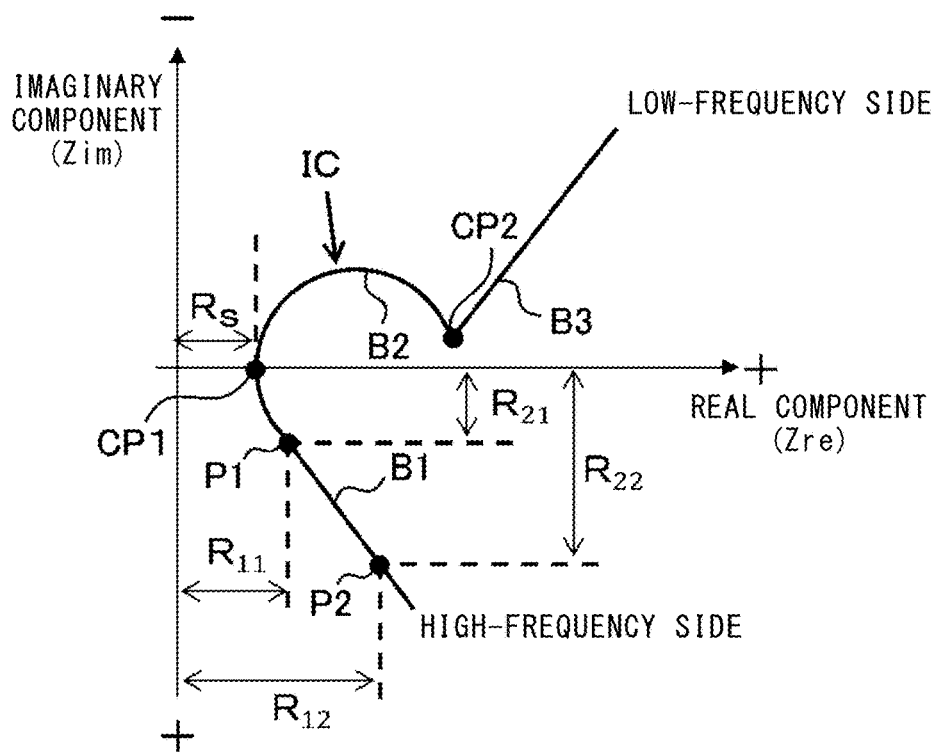
FIG. 4 illustrates an impedance to be measured and an impedance real component to be calculated in embodiment 1.

FIG. 4 illustrates the impedances measured by the impedance measurement units 111, 112 in FIG. 3 and the impedance real components calculated by the real component calculation units 113, 114 in FIG. 3. For example, the impedance measurement unit 111 measures an impedance for a point P1 in the impedance Nyquist diagram IC, and the impedance measurement unit 112 measures an impedance for a point P2 in the impedance Nyquist diagram IC. The points P1, P2 are both included in the part B1. A real component and an imaginary component at the point P1 are $R_{11}$ and $R_{21}$, respectively, and a real component and an imaginary component at the point P2 are $R_{12}$ and $R_{22}$, respectively.

The real component calculation unit 113 in FIG. 3 calculates the real component $R_{11}$ at the point P1, and the real component calculation unit 114 calculates the real component $R_{12}$ at the point P2. The degradation detection unit 115 in FIG. 3 detects degradation of the battery 100 on the basis of the impedance real components calculated by the real component calculation units 113, 114. In this example, the degradation detection unit 115 can detect degradation of the battery 100 due to corrosion of the current collecting portion 104, on the basis of the impedance real components calculated by the real component calculation units 113, 114.

Figure 5:
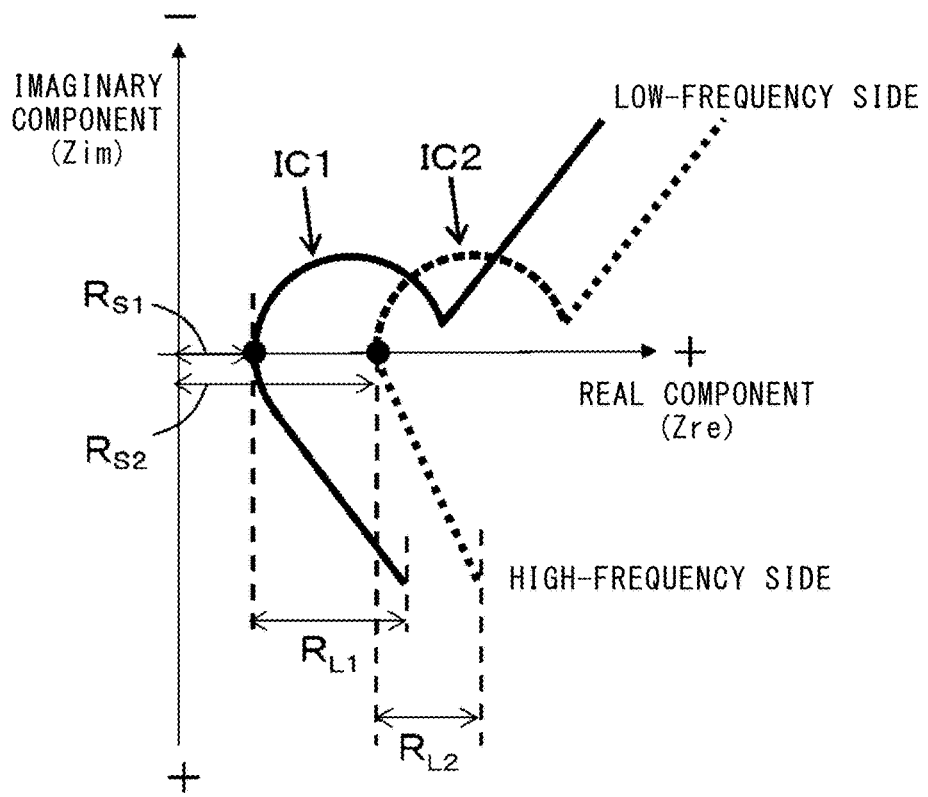
FIG. 5 shows a first example of change in the impedance due to degradation of the battery.

FIG. 5 shows a first example of change in the impedance due to degradation of the battery 100. In FIG. 5, an impedance Nyquist diagram IC1 of the battery (hereinafter, referred to as undegraded battery) 100 that has not been degraded yet is indicated by a solid line, and an impedance Nyquist diagram IC2 of the battery (hereinafter, referred to as degraded battery) 100 that has undergone degradation is indicated by a dotted line.

In FIG. 5, a real component $R_{S1}$ in the impedance Nyquist diagram IC1 and a real component $R_{S2}$ in the impedance Nyquist diagram IC2 correspond to the real component Rs in FIG. 2. In addition, a real component width $R_{L1}$ in the impedance Nyquist diagram IC1 and a real component width $R_{L2}$ in the impedance Nyquist diagram IC2 correspond to the real component width $R_L$ in FIG. 2. As described above, the real component widths $R_{L1}$, $R_{L2}$ correspond to resistance components due to the skin effect in the current collecting portion 104 of the undegraded battery 100 and the degraded battery 100.

Corrosion of the current collecting portion 104 progresses by a reaction of the surface of the current collecting portion 104 with sulfuric acid used as the electrolyte solution 103. In this case, while a corrosion product is generated, the sectional area of the current collecting portion 104 is reduced. When the sectional area of the current collecting portion 104 is reduced, the thickness of the current collecting portion 104 is reduced, so that, as described above, the influence of the skin effect is reduced. Therefore, as shown in the example in FIG. 5, the real component width $R_{L2}$ for the degraded battery 100 is smaller than the real component width $R_{L1}$ for the undegraded battery 100. In this way, whether or not the current collecting portion 104 is corroded appears as a tendency of change in the impedance real component in a range where the impedance imaginary component is positive.

The degradation detection unit 115 determines whether or not the battery 100 is degraded due to corrosion of the current collecting portion 104, on the basis of the impedance real components at the frequencies f1, f2. In this case, from the impedance real components at the frequencies f1, f2, the tendency of change in the impedance real component in a range where the impedance imaginary component is positive is figured out. Thus, whether or not the current collecting portion 104 is corroded can be determined on the basis of the impedance real components at the frequencies f1, f2, and whether or not the battery 100 is degraded can be determined on the basis of a result of the above determination.

For example, the degradation detection unit 115 detects degradation of the battery 100 on the basis of the ratio between the impedance real component calculated by the real component calculation unit 113 and the impedance real component calculated by the real component calculation unit 114. Specifically, in the example shown in FIG. 4, if $R_{11}/R_{12}$ is greater than a predetermined threshold, it is determined that the battery 100 is degraded due to corrosion of the current collecting portion 104.

Alternatively, the degradation detection unit 115 may detect degradation of the battery 100 on the basis of a difference (in the example in FIG. 4, $R_{12}-R_{11}$) between the impedance real component calculated by the real component calculation unit 113 and the impedance real component calculated by the real component calculation unit 114. For example, if the difference $R_{12}-R_{11}$ is smaller than a predetermined threshold, it is determined that the battery 100 is degraded due to corrosion of the current collecting portion 104.

The frequencies f1, f2 may be set so that the minimum value and the maximum value of the impedance real component in the part B1 in FIG. 2 are calculated by the real component calculation units 113, 114. In this case, the difference between the impedance real component calculated by the real component calculation unit 114 and the impedance real component calculated by the real component calculation unit 113 corresponds to the real component width $R_L$ in FIG. 2. In this case, the resistance component due to the skin effect in the current collecting portion 104 can be directly calculated, whereby corrosion of the current collecting portion 104 can be detected more accurately.

Still alternatively, the degradation detection unit 115 may detect degradation of the battery 100 on the basis of the slope (in the example in FIG. 4, $(R_{22}-R_{21})/(R_{12}-R_{11})$) between the impedance measured by the impedance measurement unit 111 and the impedance measured by the impedance measurement unit 112. In this case, besides the real component calculation units 113, 114, an imaginary component calculation unit for calculating imaginary components of the impedances measured by the impedance measurement units 111, 112 is provided. For example, if the slope $(R_{22}-R_{21})/(R_{12}-R_{11})$ is greater than a predetermined threshold, it is determined that the battery 100 is degraded due to corrosion of the current collecting portion 104.

The impedance of the battery 100 changes due to various factors such as reactions of the positive electrode 101 and the negative electrode 102 and decrease of the electrolyte solution 103. In the present embodiment, change in the impedance due to the influence of the skin effect in the current collecting portion 104 among various factors can be detected on the basis of the ratio, the difference, or the slope of the impedance real components at the frequencies f1, f2.

A plurality of thresholds are set stepwise for each of the impedance real component at the frequency f1 and the impedance real component at the frequency f2, and the degree of degradation due to corrosion of the current collecting portion 104 may be determined on the basis of comparison between each calculated impedance real component and the plurality of thresholds. Further, the life of the battery 100 may be determined on the basis of the calculated impedance real components.

Figure 6:
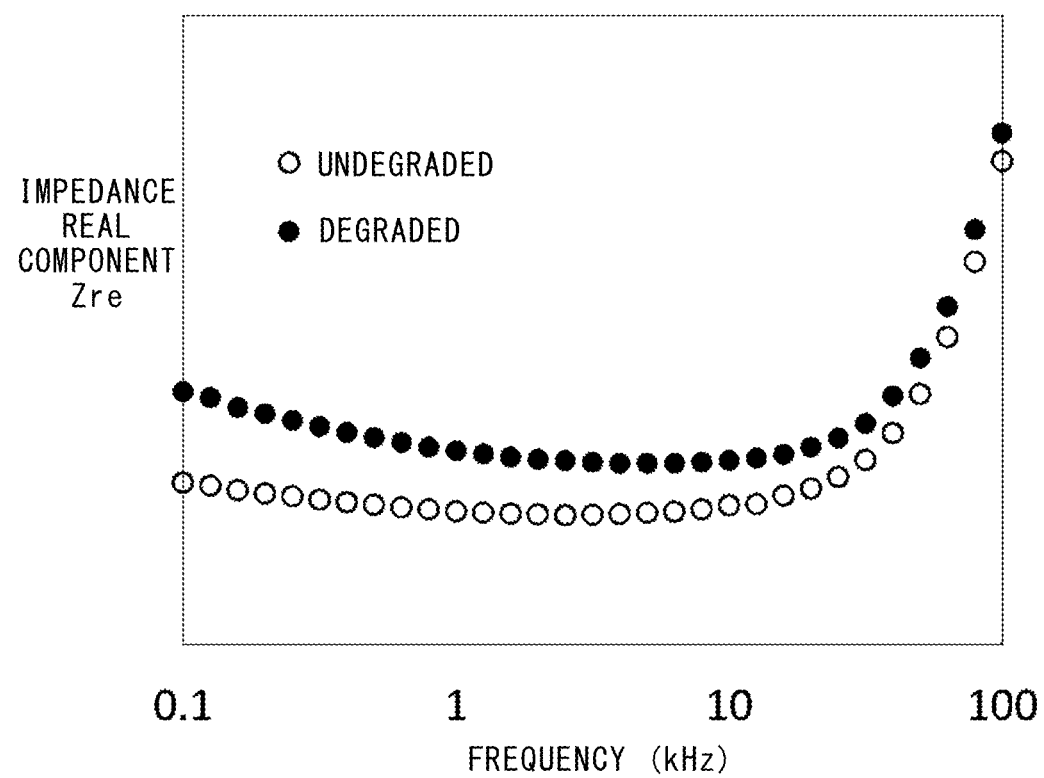
FIG. 6 shows the relationship between a frequency and an impedance real component in a general lead storage battery.

A setting example for the frequencies f1, f2 will be described. FIG. 6 shows a result of measurement of the relationship between the frequency and the impedance real component in a general lead storage battery. FIG. 6 shows the relationship between the frequency and the impedance real component in each of the undegraded battery 100 and the degraded battery 100. The horizontal axis indicates the frequency, and the vertical axis indicates the impedance real component. In the example shown in FIG. 6, for both of the undegraded battery 100 and the degraded battery 100, in a range where the frequency is equal to or smaller than 1 kHz, the impedance real component increases as the frequency decreases. This is because the influence of reactions of the positive electrode 101 and the negative electrode 102 becomes great in the range where the frequency is equal to or smaller than 1 kHz. In the range where the frequency is equal to or greater than 1 kHz and smaller than 10 kHz, the impedance real component hardly changes when the frequency changes. In the case where the frequency is equal to or greater than 1 kHz and smaller than 10 kHz, the impedance at or near the connection point CP1 in FIG. 2 is measured. In the range where the frequency is equal to or greater than 10 kHz, the impedance real component increases as the frequency increases. This is because the influence of the skin effect in the current collecting portion 104 becomes great in the range where the frequency is equal to or greater than 10 kHz.

Accordingly, it is preferable that the frequency f1 is set in a range equal to or greater than 1 kHz and smaller than 10 kHz. In addition, it is preferable that the frequency f2 is set in a range equal to or greater than 10 kHz. Thus, it is possible to appropriately measure the impedance corresponding to not a resistance component due to reactions of the positive electrode 101 and the negative electrode 102 but a resistance component due to the skin effect in the current collecting portion 104. In the example shown in FIG. 4, the impedance imaginary components at the frequencies f1, f2 (imaginary components at points P1, P2) are both positive, but as long as it is possible to obtain the tendency of change in the impedance real component in a range where the impedance imaginary component is positive, the impedance imaginary component at the frequency f1 may be negative.

In addition, it is preferable that the frequencies f1, f2 are set so that, at the frequency f1, a resistance component in a state in which the entire current collecting portion 104 forms a conduction path is acquired as an impedance real component, and at the frequency f2, a resistance component in a state in which the skin of the current collecting portion 104 forms a conduction path by the skin effect is acquired as an impedance real component. The entire current collecting portion 104 is an example of a first conduction path, and the skin of the current collecting portion 104 is an example of a second conduction path. For example, in the case where the frequency f1 is equal to or greater than 1 kHz and smaller than 10 kHz, a resistance component in a state in which the entire current collecting portion 104 forms a conduction path is calculated as an impedance real component by the real component calculation unit 113. In addition, in the case where the frequency f2 is equal to or greater than 10 kHz, a resistance component in a state in which the skin of the current collecting portion 104 forms a conduction path is calculated as an impedance real component by the real component calculation unit 114.

Figure 7:
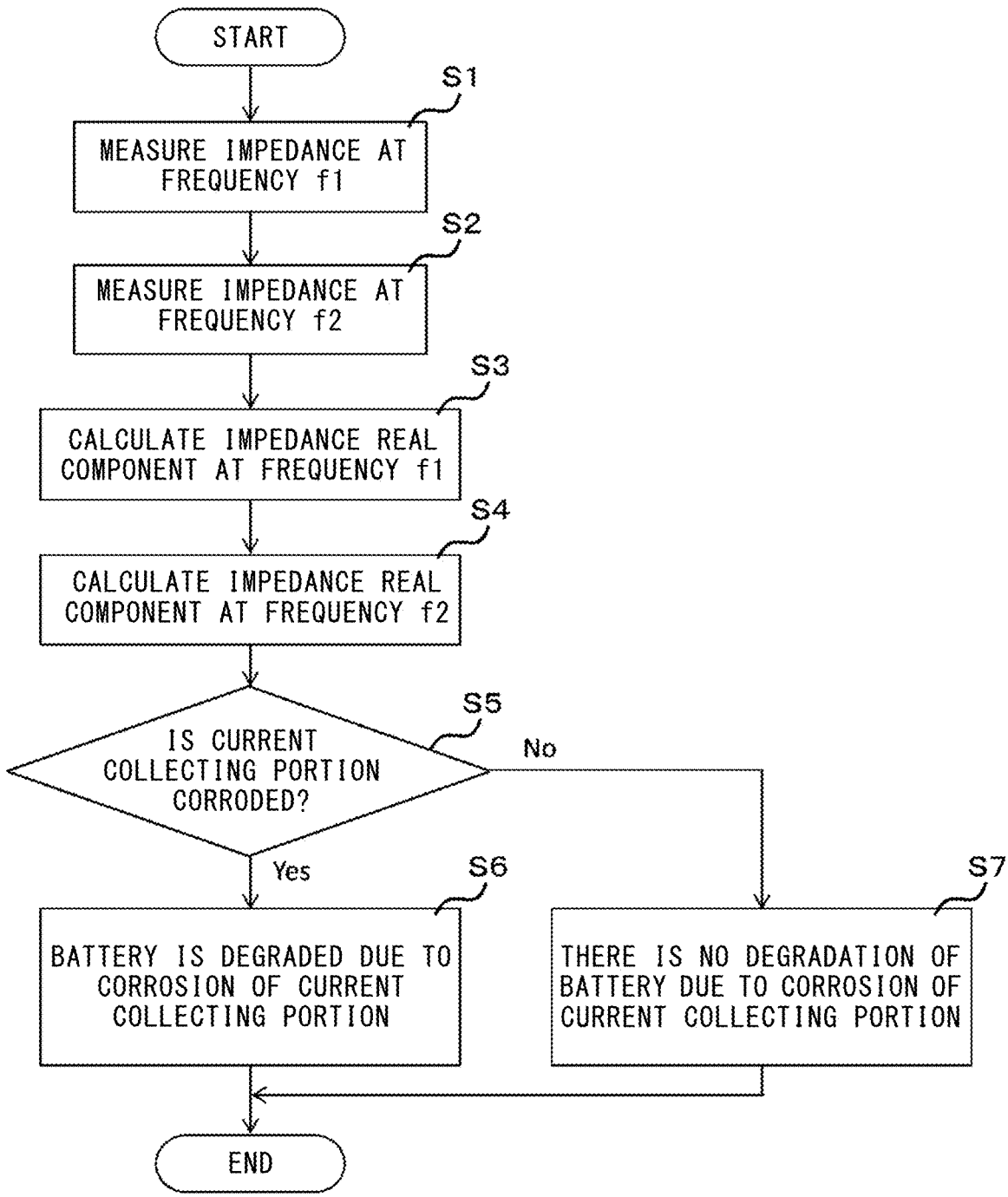
FIG. 7 is a flowchart showing a battery degradation detection process in the battery degradation detection device.

FIG. 7 is a flowchart showing a battery degradation detection process in the battery degradation detection device 10. The process shown in FIG. 7 is executed on the basis of a battery degradation detection program stored in advance, for example. In the example shown in FIG. 7, in step S1, the impedance measurement unit 111 measures the impedance of the battery 100 at the frequency f1, and in step S2, the impedance measurement unit 112 measures the impedance of the battery 100 at the frequency f2. In step S3, the real component calculation unit 113 calculates an impedance real component at the frequency f1 on the basis of the impedance measured in step S1. In step S4, the real component calculation unit 114 calculates an impedance real component at the frequency f2 on the basis of the impedance measured in step S2. In step S5, the degradation detection unit 115 determines whether or not the current collecting portion 104 of the battery 100 is corroded, on the basis of the impedance real component calculated in step S3 and the impedance real component calculated in step S4. In step S5, if it is determined that the current collecting portion 104 is corroded, the process proceeds to step S6, and if it is determined that the current collecting portion 104 is not corroded, the process proceeds to step S7. In step S6, the degradation detection unit 115 determines that the battery 100 is degraded due to corrosion of the current collecting portion 104. In step S7, the degradation detection unit 115 determines that degradation of the battery 100 due to corrosion of the current collecting portion 104 has not occurred. In this way, degradation of the battery 100 due to corrosion of the current collecting portion 104 is detected.

As described above, in the battery degradation detection device 1 according to embodiment 1, the impedances of the battery 100 at the frequencies f1, f2 are measured, and degradation of the battery 100 is detected on the basis of real components of the measured impedances. The impedance real components at the frequencies f1, f2 represent the tendency of change in the impedance real component in a range where the impedance imaginary component is positive. In this case, whether or not the current collecting portion 104 of the battery 100 is corroded appears as the tendency of change in the impedance real component in a range where the impedance imaginary component is positive. Thus, it is possible to accurately detect degradation of the battery 100 due to corrosion of the current collecting portion 104, on the basis of the impedance real components at the frequencies f1, f2.

Modifications of First Embodiment

Impedance real components for the undegraded battery 100 at the frequencies f1, f2 may be acquired in advance, and on the basis of these impedance real components, detection for degradation may be performed on a battery 100 (hereinafter, referred to as target battery 100) for which whether or not degradation has occurred is to be determined actually. For example, an impedance real component for the undegraded battery 100 at the frequency f1 is calculated in advance by the real component calculation unit 113, and the calculated value is stored as a first reference value by the degradation detection unit 115. In addition, an impedance real component for the undegraded battery 100 at the frequency f2 is calculated in advance by the real component calculation unit 114, and the calculated value is stored as a second reference value by the degradation detection unit 115. Further, an impedance real component for the target battery 100 at the frequency f1 is calculated as a first actual measurement value by the real component calculation unit 113, and an impedance real component at the frequency f2 is calculated as a second actual measurement value by the real component calculation unit 114. A difference value between the first actual measurement value and the first reference value is calculated as a first difference value, and a difference value between the second actual measurement value and the second reference value is calculated as a second difference value. If at least one of the calculated first and second difference values reaches a predetermined threshold, it is determined that the target battery 100 is degraded due to corrosion of the current collecting portion 104.

A map representing the correlation between impedance real components at the frequencies f1, f2 and the degradation degree (capacity, capacity keeping rate, etc.) of the battery 100 may be prepared in advance, and the degradation degree of the target battery 100 may be determined on the basis of calculation results of the real component calculation units 113, 114 by using the map.

Some processing may be performed on the battery 100 on the basis of a detection result of the degradation detection unit 115. For example, in the case where the control voltage (e.g., charge voltage) of the battery 100 is high, corrosion of the current collecting portion 104 readily progresses. Accordingly, when the degradation detection unit 115 has determined that the battery 100 is degraded, control input/output value or control voltage/current for the battery 100 by the AC source 108 or another power supply may be reduced so as to inhibit progress of corrosion of the current collecting portion 104. In addition, when it is determined that the life of the battery 100 is ended, a notification for encouraging replacement of the battery 100 may be given to an operator.

Figure 8:
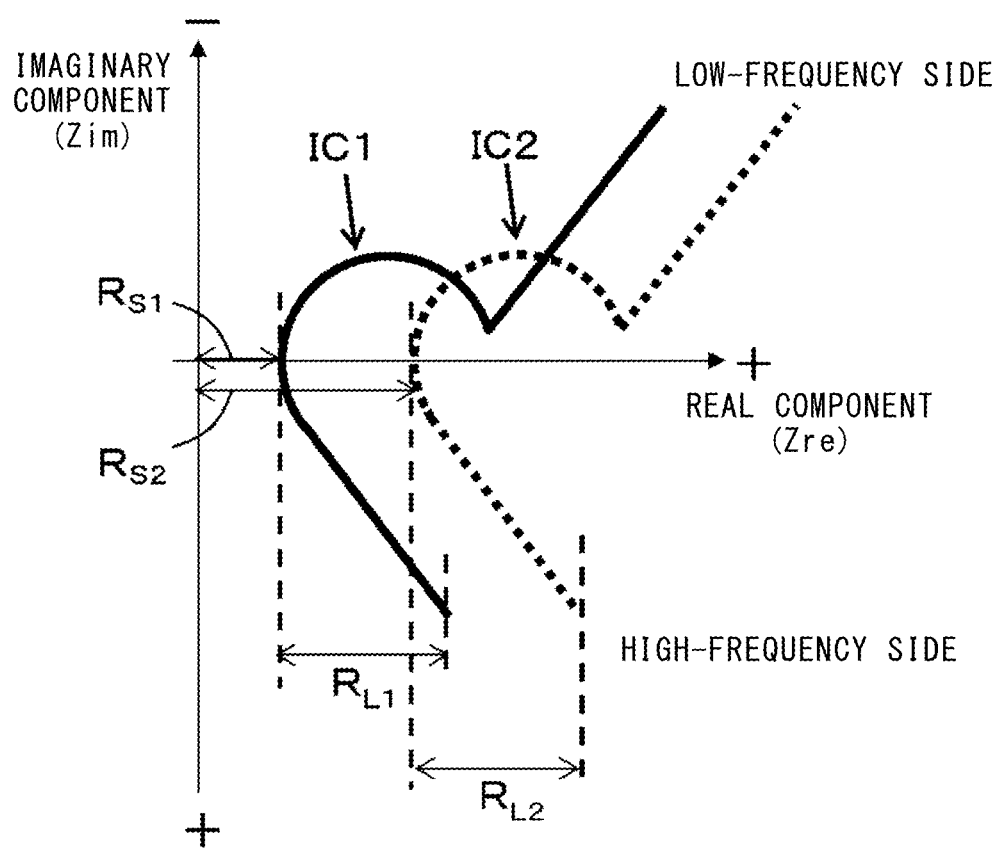
FIG. 8 shows a second example of change in the impedance due to degradation of the battery.

The degradation detection unit 115 may determine whether or not the battery 100 is degraded due to decrease or quality change of the electrolyte solution 103, on the basis of the impedance real component calculated by the real component calculation unit 113. FIG. 8 shows a second example of change in the impedance due to degradation of the battery 100. The example in FIG. 8 is different from the example in FIG. 5 as follows.

In the example in FIG. 8, the real component width Ru in the impedance Nyquist diagram ICI and the real component width RL2 in the impedance Nyquist diagram IC2 are equal to each other. This means that the resistance component due to the skin effect in the current collecting portion 104 is almost equal between the undegraded battery 100 and the degraded battery 100. That is, there is a high possibility that almost no degradation due to corrosion of the current collecting portion 104 has occurred in the degraded battery 100. Meanwhile, the real component $R_{S2}$ in the impedance Nyquist diagram IC2 is greater than the real component $R_{S1}$ in the impedance Nyquist diagram IC1. In this case, there is a high possibility that the degraded battery 100 is degraded due to decrease or quality change of the electrolyte solution 103.

Accordingly, in the case where the difference between the impedance real components for the target battery 100 at the frequencies f1, f2 is almost equal to the difference between the impedance real components for the undegraded battery 100 at the frequencies f1, f2, and the impedance real components for the target battery 100 at the frequencies f1, f2 are respectively greater than the impedance real components for the undegraded battery 100 at the frequencies f1, f2, the degradation detection unit 115 may determine that the target battery 100 is degraded due to decrease or quality change of the electrolyte solution 103. In this way, it is possible to detect not only degradation of the battery 100 due to corrosion of the current collecting portion 104 but also degradation of the battery 100 due to decrease or quality change of the electrolyte solution 103.

In the example in FIG. 5, the real component width $R_{L2}$ for the degraded battery 100 is smaller than the real component width $R_{L1}$ for the undegraded battery 100. However, there can be a case where the real component width $R_{L2}$ for the degraded battery 100 is greater than the real component width $R_{L1}$ for the undegraded battery 100. For example, when the current collecting portion 104 is corroded, the sectional area of the current collecting portion 104 is reduced and meanwhile, the current collecting portion 104 can extend in the direction in which current flows. In such a case, the value of 1 (length of conductor) in the above Expression (7) becomes great, so that the real component width $R_{L2}$ for the degraded battery 100 can become greater than the real component width $R_{L1}$ for the undegraded battery 100.

In the present embodiment, impedances at the two frequencies f1, f2 are measured by the impedance measurement units 111, 112, and impedance real components at the two frequencies f1, f2 are calculated by the real component calculation units 113, 114. However, the present invention is not limited thereto. Impedances at three or more frequencies may be measured, and impedance real components at the three or more frequencies may be calculated. In this case, accuracy of detection for degradation of the battery 100 due to corrosion of the current collecting portion 104 is further enhanced.

Embodiment 2

Figure 9:
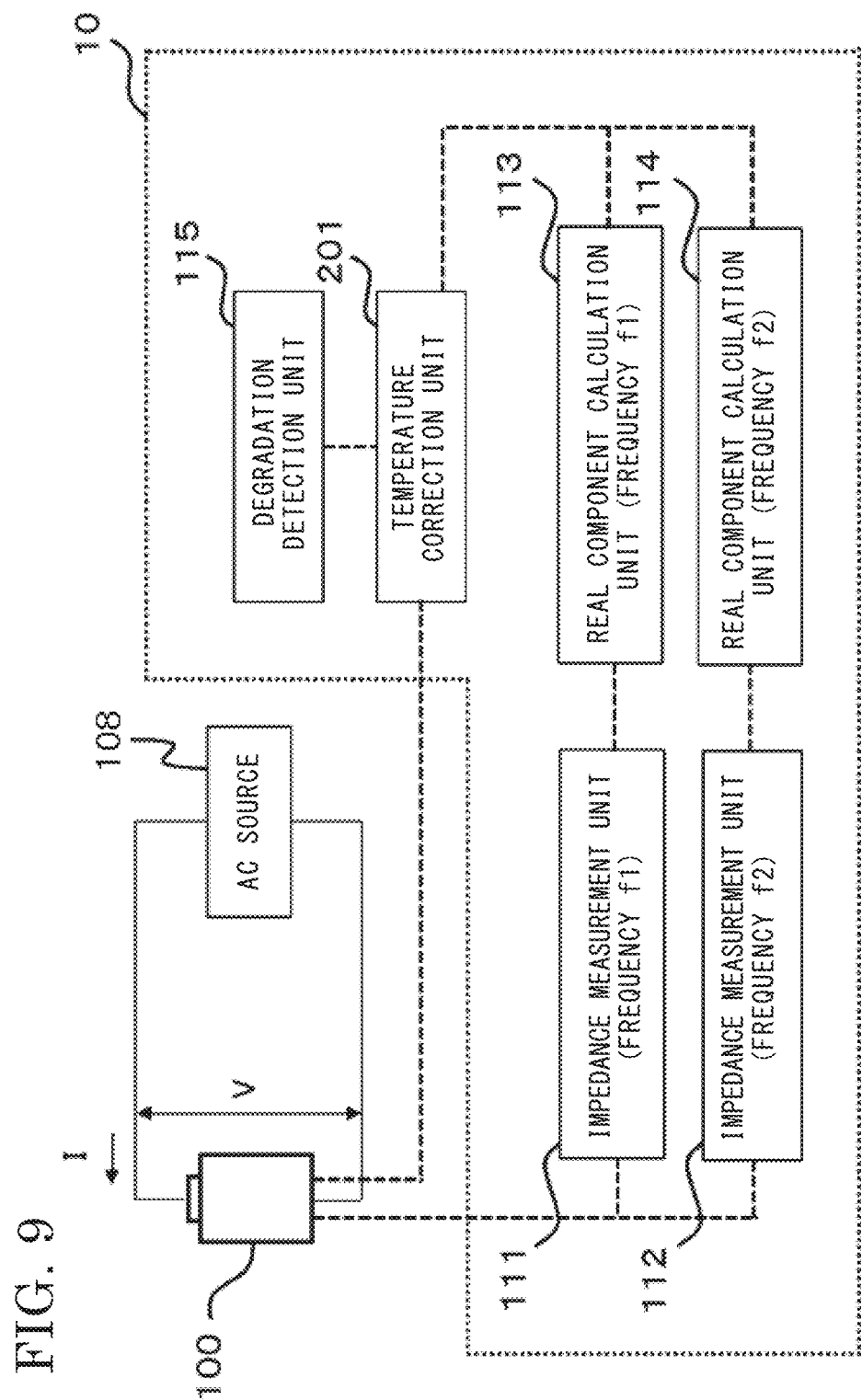
FIG. 9 is a block diagram showing the configuration of a battery degradation detection device according to embodiment 2.

A battery degradation detection device 10 according to embodiment 2 of the present invention will be described regarding differences from the above embodiment 1. FIG. 9 is a block diagram showing the configuration of the battery degradation detection device 10 according to embodiment 2. The battery degradation detection device 10 in FIG. 9 further includes a temperature correction unit 201. The temperature correction unit 201 detects the temperature of the battery 100, and corrects the impedance real components calculated by the real component calculation units 113, 114 to values corresponding to a predetermined reference temperature, on the basis of the detected temperature. The temperature correction unit 201 detects, as the temperature of the battery 100, a surface temperature of the casing CA of the battery 100, for example.

In the battery 100, as the temperature of the electrolyte solution 103 increases, the viscosity of the electrolyte solution 103 increases, and as the viscosity of the electrolyte solution 103 increases, the resistance of the electrolyte solution is reduced. That is, as the temperature of the electrolyte solution 103 increases, the resistance of the electrolyte solution 103 is reduced. In addition, as the temperature increases, thermal vibration of metal ions becomes more vigorous, so that movement of free electrons is hampered. Therefore, as the temperature increases, the DC resistance and the skin-effect-related resistance of the current collecting portion 104 are increased. Thus, the impedance real components calculated by the real component calculation units 113, 114 change depending on the temperature of the battery 100.

Accordingly, in the present embodiment, the impedance real components calculated by the real component calculation units 113, 114 are corrected to values corresponding to resistance components at the predetermined reference temperature. The degradation detection unit 115 detects degradation of the battery 100 on the basis of the corrected impedance real components, in the same manner as in the above first embodiment.

For example, the temperature correction unit 201 stores, in advance, a temperature-impedance map representing the relationship between the impedance real components at the frequencies f1, f2 and the temperature of the battery 100. The temperature correction unit 201 corrects the impedance real components calculated by the real component calculation units 113, 114, on the basis of the detected temperature of the battery 100 and the stored temperature-impedance map.

Along with change in the temperature of the battery 100, the impedance real component changes as a linear function in accordance with a substantially constant temperature coefficient. Accordingly, the temperature correction unit 201 may correct the impedance real components calculated by the real component calculation units 113, 114 to values corresponding to components at the reference temperature, on the basis of the detected temperature and the predetermined temperature coefficient.

Further, as described above, the difference between the impedance real components calculated by the real component calculation units 113, 114 in FIG. 9 corresponds to the resistance component due to the skin effect in the current collecting portion 104. Therefore, the temperature correction unit 201 may correct the impedance real components calculated by the real component calculation units 113, 114 to values corresponding to the reference temperature, on the basis of a physical property value of the current collecting portion 104. For example, as the physical property value of the current collecting portion 104, a resistance temperature coefficient α of the current collecting portion 104 is used. The relationship between a detected temperature (present temperature) T, a reference temperature $T_0$, an impedance real component R at the detected temperature T, an impedance real component $R_0$ at a reference temperature $T_0$, and the resistance temperature coefficient α of the current collecting portion 104, is represented by the following Expression (8). Therefore, it is possible to calculate the impedance real component $R_0$ from the detected temperature T, the reference temperature $T_0$, and the impedance real component R by using the following Expression (8).

$$R=R_0\{1+\alpha(T-T_0)\} \quad (8)$$

As described above, in embodiment 2, even if the impedance real components at the frequencies f1, f2 change due to change in the ambient temperature or the like, the impedance real components are corrected so as to correspond to a certain reference temperature. Thus, it is possible to accurately detect degradation of the battery 100 due to corrosion of the current collecting portion 104 without being influenced by the temperature.

Embodiment 3

Figure 10:
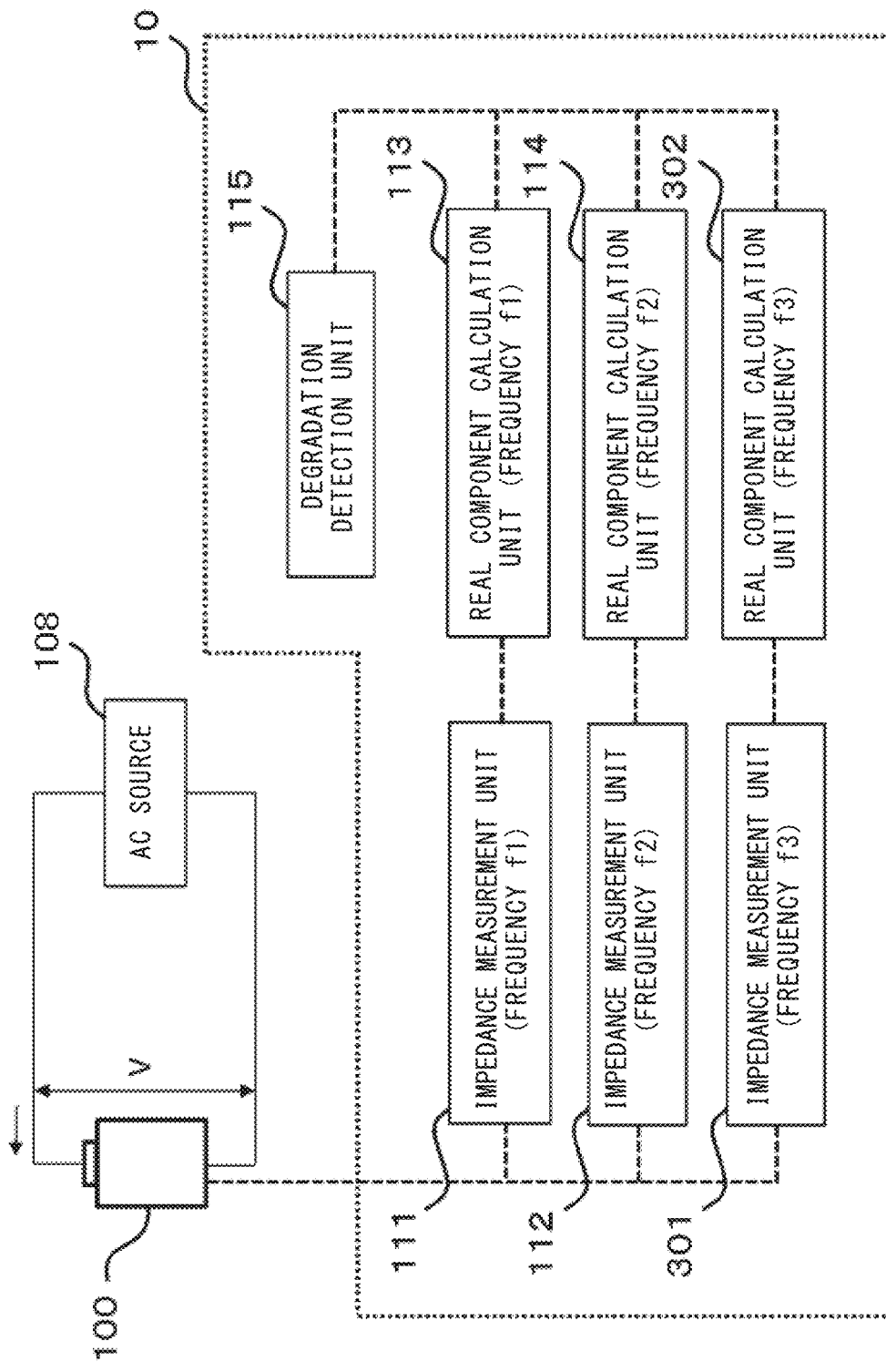
FIG. 10 is a block diagram showing the configuration of a battery degradation detection device according to embodiment 3.

A battery degradation detection device 10 according to embodiment 3 of the present invention will be described regarding differences from the above embodiment 1. FIG. 10 is a block diagram showing the configuration of the battery degradation detection device 10 according to embodiment 3. The battery degradation detection device 10 in FIG. 10 further includes an impedance measurement unit 301 and a real component calculation unit 302. The impedance measurement unit 301 measures the impedance of the battery 100 at a frequency f3. The real component calculation unit 302 calculates a real component of the impedance measured by the impedance measurement unit 301.

The frequency f3 is set so that an imaginary component of the measured impedance is negative. For example, the frequency f3 is set so that the impedance for the connection point CP2 in FIG. 2 is measured. As described above, the impedance of the battery 100 having a negative imaginary component is due to reactions of the positive electrode 101 and the negative electrode 102.

Figure 11:
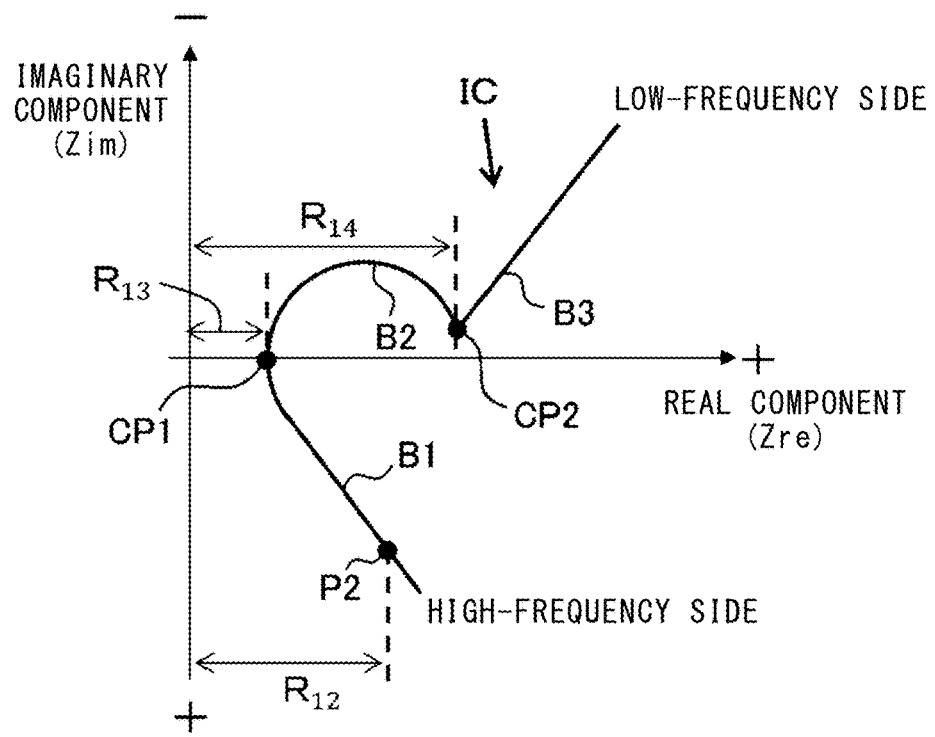
FIG. 11 illustrates an impedance to be measured and an impedance real component to be calculated in embodiment 3.

FIG. 11 illustrates impedances measured by the impedance measurement units 111, 112, 301 in FIG. 10 and impedance real components calculated by the real component calculation units 113, 114, 302 in FIG. 10. The example in FIG. 11 is different from the example in FIG. 4 as follows. In the example in FIG. 11, the impedance measurement unit 111 measures the impedance for the connection point CP1 in the impedance Nyquist diagram IC, and the real component calculation unit 113 calculates the real component $R_{13}$ for the connection point CP1. The real component $R_{13}$ corresponds to the real component Rs in FIG. 2. The impedance measurement unit 112 and the real component calculation unit 114 perform measurement of the impedance and calculation of an impedance real component in the same manner as in the example in FIG. 4. The impedance measurement unit 301 measures the impedance for the connection point CP2 in the impedance Nyquist diagram IC. The real component calculation unit 302 calculates a real component $R_{14}$ for the connection point CP2.

Figure 12:
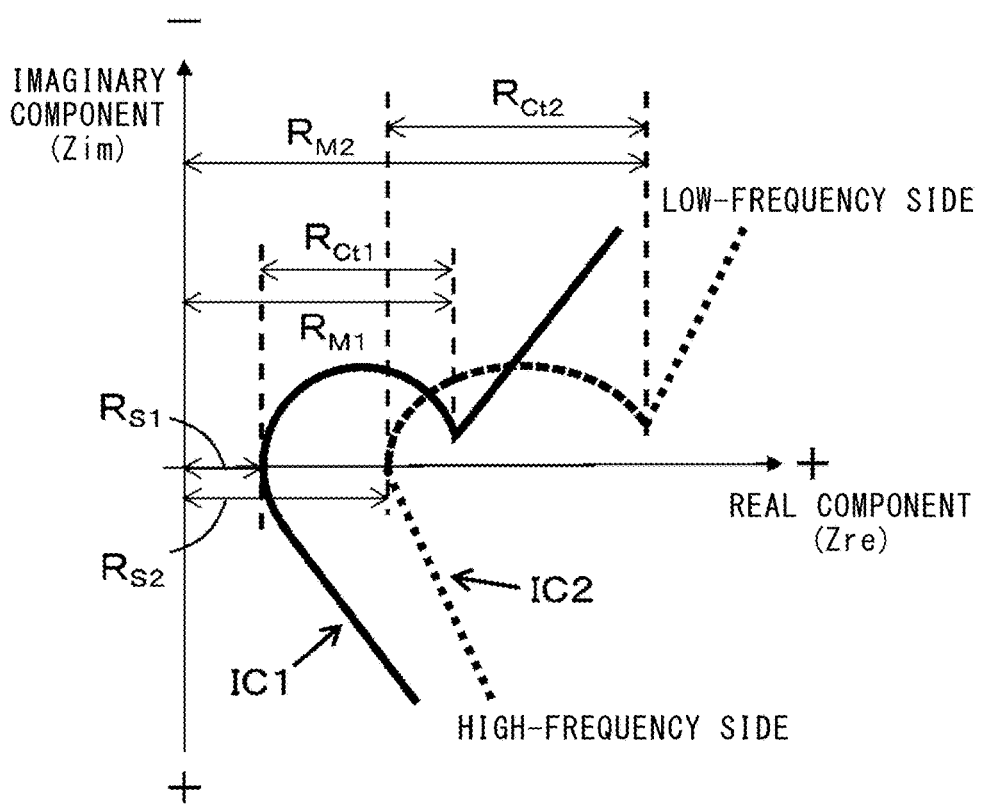
FIG. 12 shows a third example of change in the impedance due to degradation of the battery.

FIG. 12 shows a third example of change in the impedance due to degradation of the battery 100. The example in FIG. 12 is different from the example in FIG. 5 as follows. In FIG. 12, a real component width $R_{Ct1}$ in the impedance Nyquist diagram IC1 and a real component width $R_{Ct2}$ in the impedance Nyquist diagram IC2 correspond to the real component width $R_{Ct}$ in FIG. 2. As described above, the real component widths $R_{Ct1}$, $R_{Ct2}$ correspond to the reaction resistance of the positive electrode 101 and the negative electrode 102. Along with changes in the states of the positive electrode 101 and the negative electrode 102, the reaction resistance of the positive electrode 101 and the negative electrode 102 increases. Therefore, the real component width $R_{Ct2}$ for the degraded battery 100 is greater than the real component width $R_{Ct1}$ for the undegraded battery 100.

The degradation detection unit 115 in FIG. 10 detects degradation of the battery 100 due to changes in the states of the positive electrode 101 and the negative electrode 102, on the basis of the impedance real components calculated by the real component calculation units 113, 302. The difference between the impedance real component calculated by the real component calculation unit 302 and the impedance real component calculated by the real component calculation unit 113 corresponds to the real component width $R_{Ct}$ in FIG. 2 (real component widths $R_{Ct1}$, $R_{Ct2}$ in FIG. 12). Accordingly, the degradation detection unit 115 in FIG. 10 may determine whether or not the battery 100 is degraded due to changes in the states of the positive electrode 101 and the negative electrode 102, on the basis of the difference between the impedance real component calculated by the real component calculation unit 302 and the impedance real component calculated by the real component calculation unit 113. For example, if the difference $R_{14}-R_{13}$ between the real components $R_{13}$, $R_{14}$ in FIG. 11 is greater than a predetermined threshold, it is determined that the battery 100 is degraded due to changes in the states of the positive electrode 101 and the negative electrode 102.

The degradation detection unit 115 may detect degradation of the battery 100 due to changes in the states of the positive electrode 101 and the negative electrode 102, on the basis of the ratio between the impedance real component calculated by the real component calculation unit 113 and the impedance real component calculated by the real component calculation unit 302. Impedances having negative imaginary components may be measured at two or more frequencies, and on the basis of real components of these impedances, whether or not the battery 100 is degraded may be determined.

In embodiment 3, it is possible to detect degradation of the battery 100 due to changes in the states of the positive electrode 101 and the negative electrode 102, in addition to degradation of the battery 100 due to corrosion of the current collecting portion 104 and degradation of the battery 100 due to decrease or quality change of the electrolyte solution 103. In addition, as in embodiment 1, it is also possible to determine the degree of degradation of the battery 100 due to changes in the states of the positive electrode 101 and the negative electrode 102. In addition, the temperature correction unit 201 in FIG. 9 may be provided to the battery degradation detection device 10 in FIG. 10.

Embodiment 4

Figure 13:
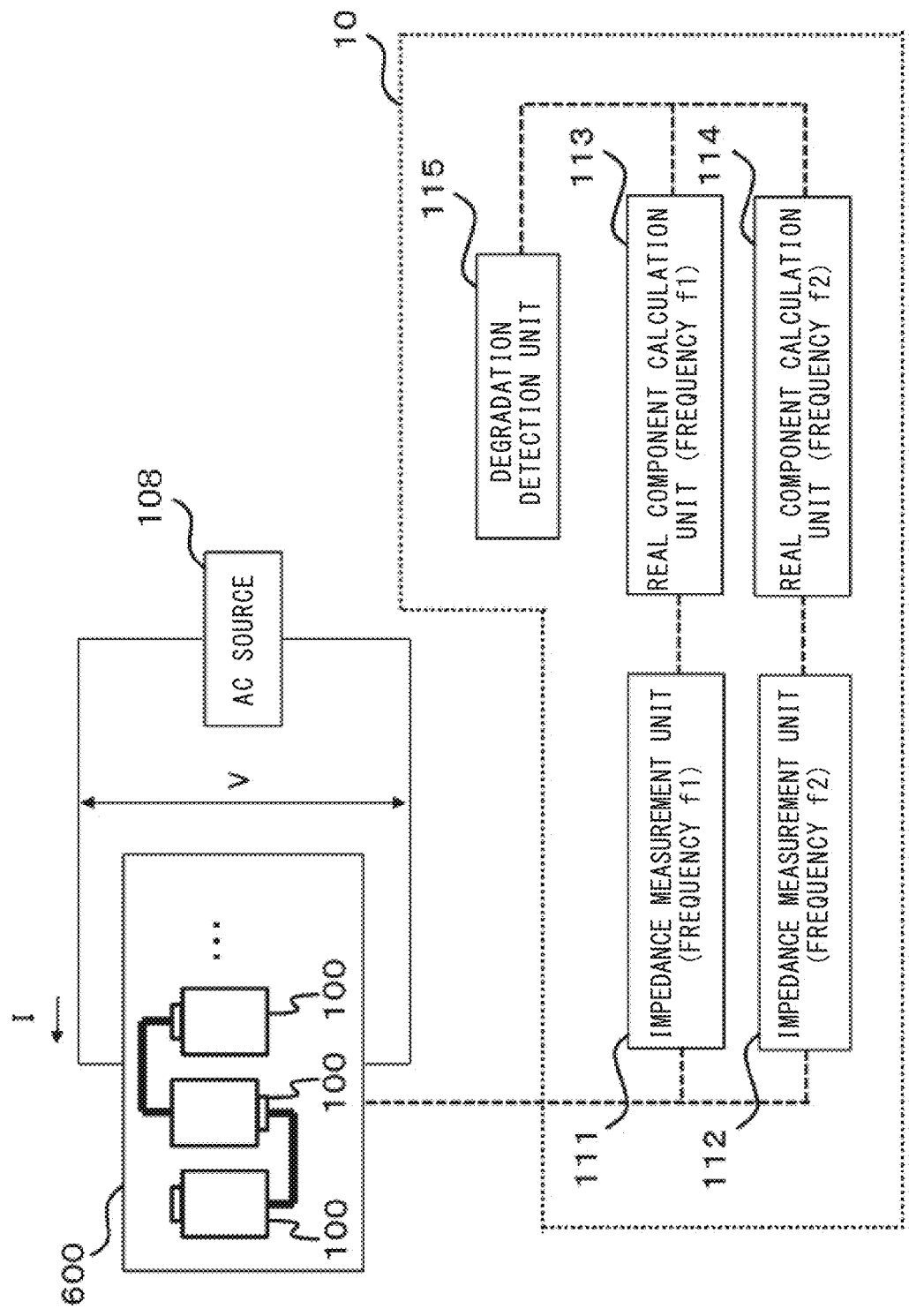
FIG. 13 is a block diagram showing the configuration of a battery degradation detection device according to embodiment 4.

A battery degradation detection device 10 according to embodiment 4 of the present invention will be described regarding difference from the above embodiment 1. FIG. 13 is a block diagram showing the configuration of the battery degradation detection device 10 according to embodiment 4. The battery degradation detection device 10 in FIG. 13 detects degradation of a battery module 600, instead of the battery 100. The battery module 600 includes n batteries 100 connected in series or parallel to each other.

The impedance measurement unit 111 measures the impedance of the battery module 600 at the frequency f1 on the basis of a current response or a voltage response of the battery module 600. The impedance measurement unit 112 measures the impedance of the battery module 600 at the frequency f2 on the basis of a current response or a voltage response of the battery module 600. The real component calculation unit 113 calculates a real component of the impedance measured by the impedance measurement unit 111. The real component calculation unit 114 calculates a real component of the impedance measured by the impedance measurement unit 112. The degradation detection unit 115 detects degradation of the battery module 600 on the basis of the impedance real components calculated by the real component calculation units 113, 114. For example, whether or not the battery module 600 is degraded due to corrosion of the current collecting portion 104 of each battery 100 is determined.

Here, in the case where a DC resistance or skin-effect-related resistance component (hereinafter, referred to as connection resistance component) in wiring metal (e.g., bus bar) for connecting the n batteries 100 to each other occupies a large proportion in the impedance real components calculated by the real component calculation units 113, 114, degradation of the battery module 600 cannot be appropriately detected.

Accordingly, on the basis of the impedance real component for the battery module 600 that has not been degraded yet (hereinafter, referred to as undegraded battery module 600), detection for degradation may be performed on a battery module 600 (hereinafter, referred to as target battery module 600) for which whether or not degradation has occurred is to be determined actually. Specifically, impedance real components for the undegraded battery module 600 at the frequencies f1, f2 are acquired in advance by the impedance measurement units 111, 112 and the real component calculation units 113, 114, and then stored by the degradation detection unit 115. Then, impedance real components for the target battery module 600 at the frequencies f1, f2 are acquired by the impedance measurement units 111, 112 and the real component calculation units 113, 114 for the target battery module 600. The differences between the acquired impedance real components for the target battery module 600 and the impedance real components for the undegraded battery module 600 stored in advance, are calculated, and whether or not the target battery module 600 is degraded is determined on the basis of the differences.

A connection resistance component may be calculated in advance. For example, the impedance real component for each individual undegraded battery 100 is acquired by the impedance measurement units 111, 112 and the real component calculation units 113, 114. The impedance real component for the battery module 600 including the n undegraded batteries 100 is calculated from the acquired impedance real components of the individual undegraded batteries 100. Meanwhile, the impedance real component for the undegraded battery module 600 is calculated by the impedance measurement units 111, 112 and the real component calculation units 113, 114.

In this case, the difference between the impedance real component for the undegraded battery module 600 obtained by actual measurement and the impedance real component for the battery module 600 obtained through calculation from the impedance real components of the individual undegraded batteries 100, corresponds to the connection resistance component. Accordingly, for the target battery module 600, the impedance real component is acquired by the impedance measurement units 111, 112 and the real component calculation units 113, 114, and the connection resistance component calculated as described above is subtracted from the acquired impedance real component. Thus, the impedance real component for the target battery module 600 from which the connection resistance component is excluded is obtained. On the basis of the obtained impedance real component, degradation of the target battery module 600 can be appropriately detected.

In the example shown in FIG. 13, degradation of the battery module 600 is detected by using the battery degradation detection device 10 shown in FIG. 3. However, degradation of the battery module 600 may be detected by using the battery degradation detection device 10 shown in FIG. 9 or FIG. 10.

Embodiment 5

Figure 14:
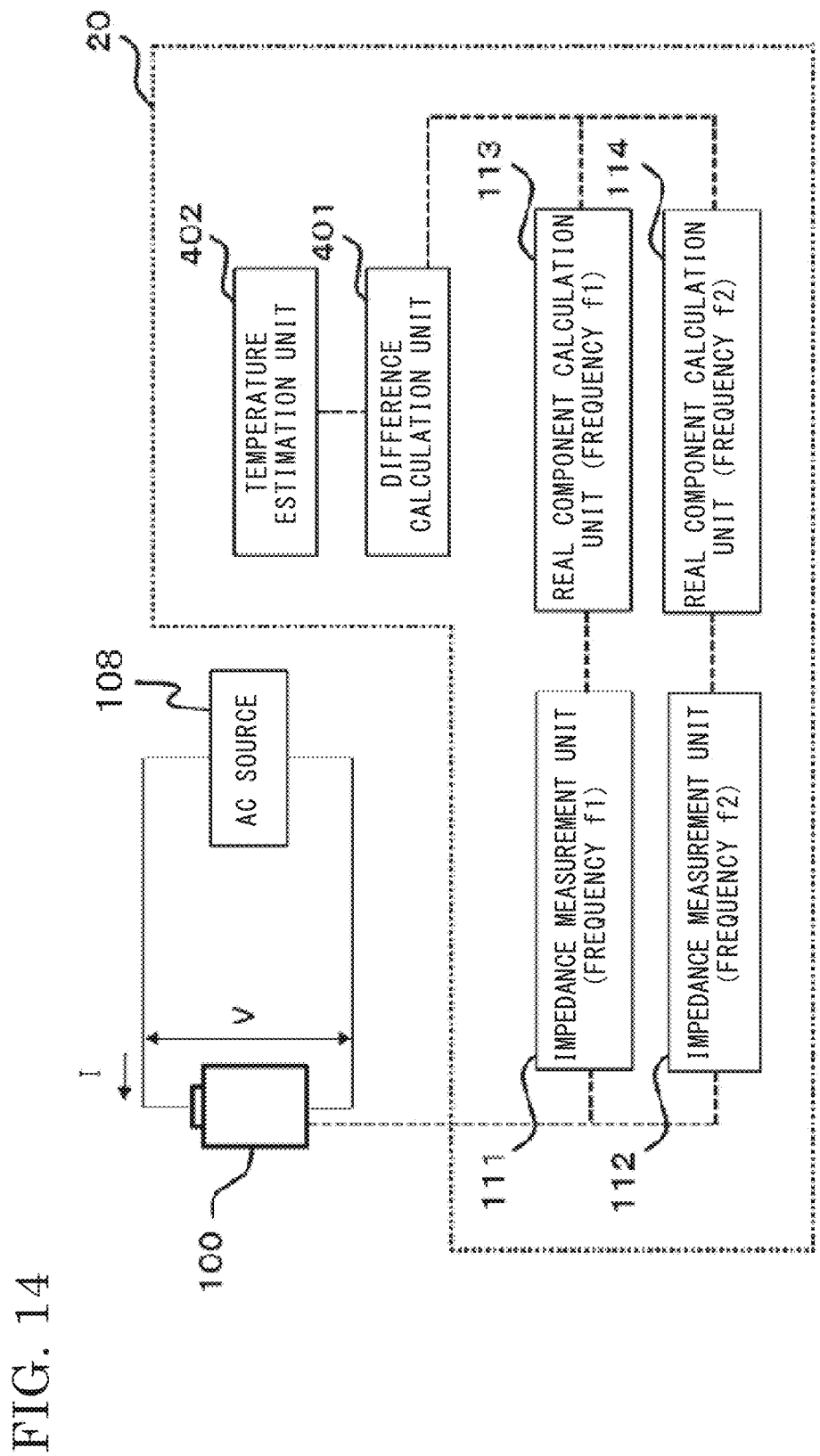
FIG. 14 is a block diagram showing the configuration of a battery temperature estimation device according to embodiment 5.

A battery temperature estimation device according to embodiment 5 of the present invention will be described. FIG. 14 is a block diagram showing the configuration of the battery temperature estimation device according to embodiment 5. A battery temperature estimation device 20 in FIG. 14 is different from the battery degradation detection device 10 in FIG. 1 as follows.

The battery temperature estimation device 20 according to embodiment 5 includes a difference calculation unit 401 and a temperature estimation unit 402, instead of the degradation detection unit 115. The difference calculation unit 401 calculates the difference (hereinafter, referred to as difference component) between the impedance real component calculated by the real component calculation unit 113 and the impedance real component calculated by the real component calculation unit 114. The temperature estimation unit 402 estimates the internal temperature of the battery 100 on the basis of the difference component calculated by the difference calculation unit 401.

In this example, the frequencies f1, f2 are set so that the impedance real components calculated by the real component calculation units 113, 114 become the minimum value and the maximum value of the real component in the part B1 in the impedance Nyquist diagram IC (FIG. 2). In this case, the difference component corresponds to the real component width $R_L$ in FIG. 2, and corresponds to the resistance component due to the skin effect occurring in the current collecting portion 104. Thus, the temperature estimation unit 402 can estimate the internal temperature of the battery 100 by the above Expression (8) on the basis of the difference component calculated by the difference calculation unit 401.

Specifically, the difference component at a reference temperature is stored in advance as a reference difference component by the temperature estimation unit 402. In the above Expression (8), the difference component calculated by the difference calculation unit 401 is used as the impedance real component R, and the reference difference component stored in advance is used as the impedance real component $R_0$. In addition, the reference temperature $T_0$ and the resistance temperature coefficient α are already known. Thus, the temperature estimation unit 402 can estimate the present temperature T by using the above Expression (8). The temperature estimation unit 402 may estimate the internal temperature of the battery 100 by using a map representing the relationship between the difference component and the temperature.

In the case of measuring the temperature of the battery 100 by a thermistor or a thermocouple, it is possible to measure the exterior temperature of the battery 100 or the temperature around the battery 100, but it is difficult to measure the internal temperature of the battery 100. Therefore, there is a difference between the measured temperature and the actual internal temperature of the battery 100, so that it is impossible to acquire an accurate internal temperature of the battery 100. In contrast, the battery temperature estimation device 20 according to embodiment 5 can accurately estimate the internal temperature of the battery 100 on the basis of the difference component calculated by the difference calculation unit 401.

In addition, some processing may be performed on the battery 100 on the basis of the estimated internal temperature. For example, in the case where the estimated internal temperature is higher than a predetermined upper threshold, cooling processing for the battery 100 may be performed so as to decrease the internal temperature of the battery 100. On the other hand, in the case where the estimated internal temperature is lower than a predetermined lower threshold, temperature increasing processing for the battery 100 may be performed so as to increase the internal temperature for the battery 100.

OTHER EMBODIMENTS

Figure 15:
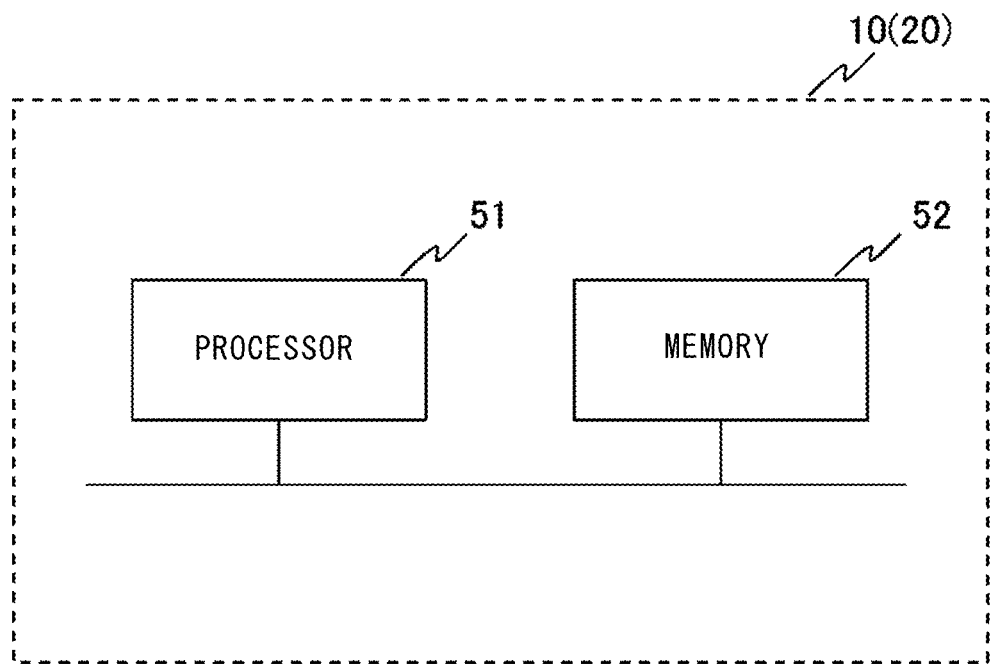
FIG. 15 is a diagram showing an example in which at least a part of the functions of the battery degradation detection device and the battery temperature estimation device is implemented by software.

Each function of the battery degradation detection device 10 and the battery temperature estimation device 20 may be implemented by hardware such as an electronic circuit, or may be implemented by software. FIG. 15 is a diagram showing an example in which at least a part of the functions of the battery degradation detection device 10 and the battery temperature estimation device 20 is implemented by software. In the example shown in FIG. 15, the battery degradation detection device 10 and the battery temperature estimation device 20 include a processing device (processor) 51 and a storage device (memory) 52. The processing device 51 is, for example, a central processing unit (CPU), and reads and executes a program stored in the storage device 52, whereby at least a part of the functions of the battery degradation detection device 10 and the battery temperature estimation device 20 in the above embodiments can be implemented.

DESCRIPTION OF THE REFERENCE CHARACTERS

10 battery degradation detection device
20 battery temperature estimation device
100 battery
111, 112, 301 impedance measurement unit
113, 114, 302 real component calculation unit
115 degradation detection unit
201 temperature correction unit
401 difference calculation unit
402 temperature estimation unit

The invention claimed is:

1. A battery degradation detection device comprising:
an impedance measurement processing circuitry for measuring impedances of a battery at a plurality of frequencies; and
a degradation detector for detecting degradation of the battery on the basis of real components of the impedances at the plurality of frequencies measured by the impedance measurement processing circuitry, wherein
the impedance for at least one of the plurality of frequencies has a positive imaginary component,
the real components of the impedances at the plurality of frequencies represent a tendency of change in the real component of the impedance of the battery in a range where the imaginary component of the impedance is positive,
the plurality of frequencies include a first frequency and a second frequency higher than the first frequency,
the real component of the impedance measured at the first frequency corresponds to a resistance component of a first conduction path in a current collecting portion of the battery, and the real component of the impedance measured at the second frequency corresponds to a resistance component of a second conduction path in the current collecting portion, and
the second conduction path is formed in a part of the first conduction path, due to a skin effect in the current collecting portion.

2. The battery degradation detection device according to claim 1, wherein the impedances at the plurality of frequencies each have an imaginary component equal to or greater than 0.

3. The battery degradation detection device according to claim 1, further comprises a temperature corrector for correcting the real components of the impedances measured by the impedance measurement processing circuitry to values corresponding to resistance components at a predetermined reference temperature.

4. The battery degradation detection device according to claim 1, wherein
the impedance measurement processing circuitry measures impedances at the plurality of frequencies, for a battery module including a plurality of batteries connected to each other, and the degradation detector detects degradation of the battery module.

5. The battery degradation detection device according to claim 1, wherein
the first frequency is equal to or greater than 1 kHz and smaller than 10 kHz.

6. The battery degradation detection device according to claim 1, wherein
the second frequency is equal to or greater than 10 kHz.

7. A battery degradation detection device comprising:
an impedance measurement processing circuitry for measuring impedances of a battery at a plurality of frequencies; and
a degradation detector for detecting degradation of the battery on the basis of real components of the impedances at the plurality of frequencies measured by the impedance measurement processing circuitry, wherein
the impedance for at least one of the plurality of frequencies has a positive imaginary component,
the degradation detector detects degradation of the battery on the basis of a difference between the real components of the impedances at the plurality of frequencies,
the real components of the impedances at the plurality of frequencies represent a tendency of change in the real component of the impedance of the battery in a range where the imaginary component of the impedance is positive,
the plurality of frequencies include a first frequency and a second frequency higher than the first frequency,
the real component of the impedance measured at the first frequency corresponds to a resistance component of a first conduction path in a current collecting portion of the battery, and the real component of the impedance measured at the second frequency corresponds to a resistance component of a second conduction path in the current collecting portion, and
the second conduction path is formed in a part of the first conduction path, due to a skin effect in the current collecting portion.

8. A battery degradation detection device comprising:
an impedance measurement processing circuitry for measuring impedances of a battery at a plurality of frequencies; and
a degradation detector for detecting degradation of the battery on the basis of real components of the impedances at the plurality of frequencies measured by the impedance measurement processing circuitry, wherein
the impedance for at least one of the plurality of frequencies has a positive imaginary component,
the plurality of frequencies include a first frequency and a second frequency higher than the first frequency,
the real component of the impedance measured at the first frequency corresponds to a resistance component of a first conduction path in a current collecting portion of the battery, and the real component of the impedance measured at the second frequency corresponds to a resistance component of a second conduction path in the current collecting portion, and
the second conduction path is formed in a part of the first conduction path, due to a skin effect in the current collecting portion.

9. The battery degradation detection device according to claim 8, wherein the first frequency is equal to or greater than 1 kHz and smaller than 10 kHz.

10. The battery degradation detection device according to claim 8, wherein the second frequency is equal to or greater than 10 kHz.

11. The battery degradation detection device according to claim 8, wherein
the impedance measurement processing circuitry measures impedances at the plurality of frequencies, for a battery module including a plurality of batteries connected to each other, and
the degradation detector detects degradation of the battery module.

* * * * *